(12) United States Patent
Sano

(10) Patent No.: US 11,388,816 B2
(45) Date of Patent: Jul. 12, 2022

(54) FLEXIBLE SUBSTRATE

(71) Applicant: Japan Display Inc., Tokyo (JP)

(72) Inventor: Takumi Sano, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 17/333,165

(22) Filed: May 28, 2021

(65) Prior Publication Data

US 2021/0289621 A1 Sep. 16, 2021

Related U.S. Application Data

(63) Continuation of application No. PCT/JP2019/035582, filed on Sep. 10, 2019.

(30) Foreign Application Priority Data

Nov. 30, 2018 (JP) .............................. JP2018-225239

(51) Int. Cl.
H05K 1/02 (2006.01)
H05K 1/03 (2006.01)
H05K 1/18 (2006.01)

(52) U.S. Cl.
CPC ........... H05K 1/0283 (2013.01); *H05K 1/036* (2013.01); *H05K 1/185* (2013.01); *H05K 2201/09063* (2013.01); *H05K 2201/09227* (2013.01); *H05K 2201/09672* (2013.01); *H05K 2201/10015* (2013.01); *H05K 2201/10022* (2013.01); *H05K 2201/10083* (2013.01); *H05K 2201/10106* (2013.01); *H05K 2201/10151* (2013.01); *H05K 2201/10166* (2013.01); *H05K 2201/10174* (2013.01)

(58) Field of Classification Search
CPC ....... H05K 1/0283; H05K 1/036; H05K 1/185
See application file for complete search history.

(56) References Cited

U.S. PATENT DOCUMENTS 8,207,473 B2 6/2012 Axisa et al.
9,391,286 B1 7/2016 Kwon et al.
(Continued)

FOREIGN PATENT DOCUMENTS

JP 2009-76663 A 4/2009
JP 2015-198101 A 11/2015
(Continued)

OTHER PUBLICATIONS

Machine Translation of JP 2009-076663 Apr. 2009 (Year: 2009).*
(Continued)

*Primary Examiner* — Jeremy C Norris
(74) *Attorney, Agent, or Firm* — Xsensus LLP

(57) ABSTRACT

According to one embodiment, a flexible substrate includes a flexible insulation base material and a plurality of wiring lines provided on one surface side of the insulation base material, and the insulation base material includes a thinned first area and a second area having a thickness larger than that of the first area, the first area includes a first lower surface, the second area includes a second lower surface, the first lower surface and the second lower surface are formed on an opposite side of a surface on which the wiring lines are provided, and the first lower surface includes an inclined portion inclined towards the second lower surface.

10 Claims, 9 Drawing Sheets

(56) References Cited

U.S. PATENT DOCUMENTS

| | | |
|---|---|---|
| 2015/0282294 A1 | 10/2015 | Wakuda et al. |
| 2015/0282296 A1 | 10/2015 | Ogura et al. |
| 2016/0293571 A1 | 10/2016 | Yoon et al. |
| 2017/0181276 A1 | 6/2017 | Sawada et al. |

FOREIGN PATENT DOCUMENTS

| | | |
|---|---|---|
| JP | 2015-198102 A | 11/2015 |
| JP | 2017-113088 A | 6/2017 |
| JP | 2017-118109 A | 6/2017 |
| WO | 2009/038950 A2 | 3/2009 |

OTHER PUBLICATIONS

International Search Report and Written Opinion dated Nov. 26, 2019, received for PCT Application PCT/JP2019/035582, Filed on Sep. 10, 2019, 10 pages including English Translation.

\* cited by examiner

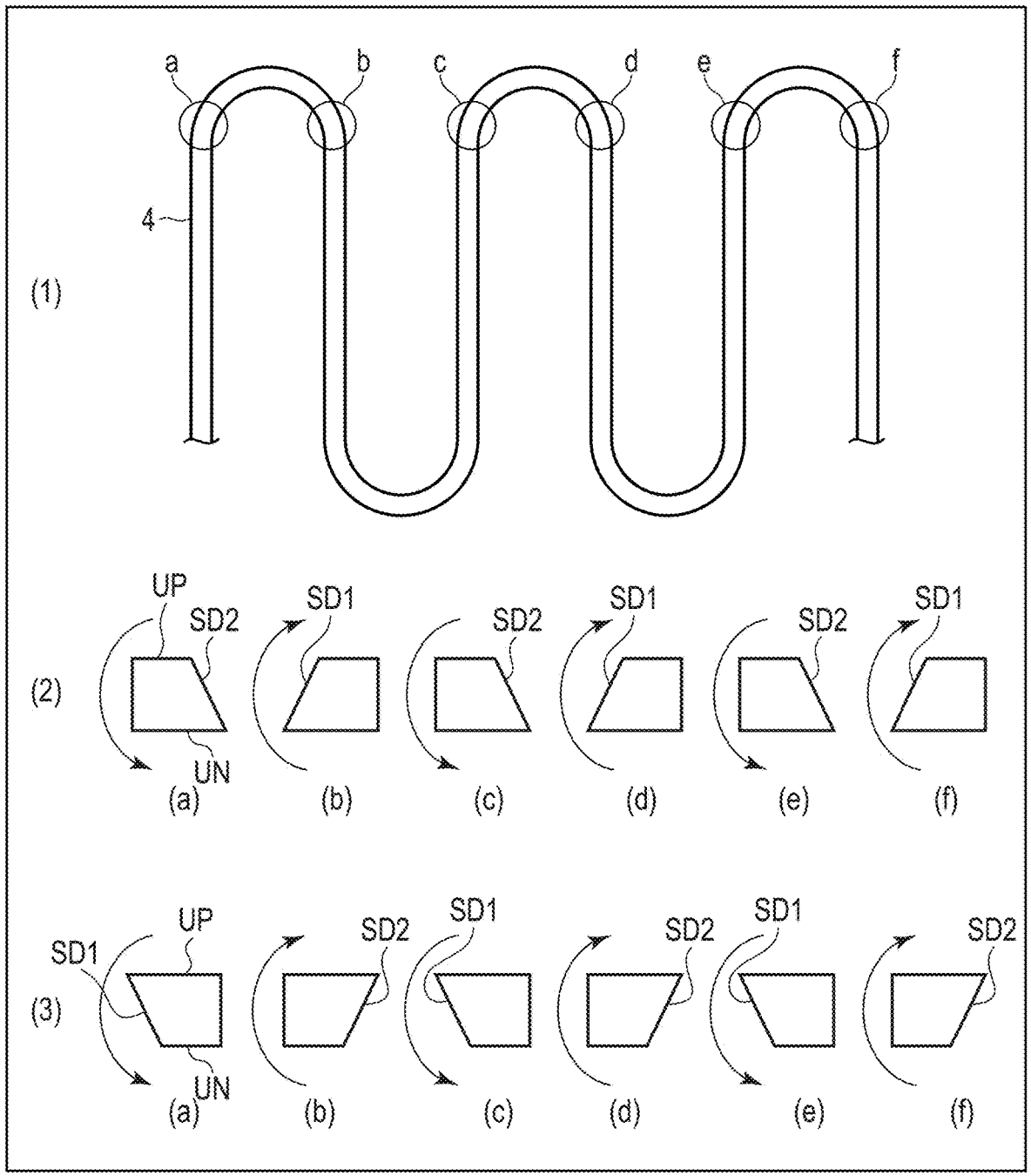
F I G. 10

FLEXIBLE SUBSTRATE

CROSS-REFERENCE TO RELATED APPLICATIONS

This application is a Continuation Application of PCT Application No. PCT/JP2019/035582, filed Sep. 10, 2019 and based upon and claiming the benefit of priority from Japanese Patent Application No. 2018-225239, filed Nov. 30, 2018, the entire contents of all of which are incorporated herein by reference.

FIELD

Embodiments described herein relate generally to a flexible substrate.

BACKGROUND

Recently, the use of flexible substrates having flexibility and elasticity has been discussed in various fields. For example, such a use mode can be considered that a flexible substrate in which electric elements are arranged in a matrix is attached on a curved surface of a housing of an electronic device, a human body or the like. As the electric elements, for example, various sensors such as a touch sensor, a temperature sensor and the alike and a display element can be applied.

For the flexible substrates, it is necessary to take measures so that the wiring is not damaged by stress due to bending or expansion and contraction. As such measures, for example, it has been proposed to provide a honeycomb-shaped opening in a base material that supports the wiring, or to form the wiring into a meandering shape.

BRIEF DESCRIPTION OF THE DRAWINGS

FIG. 10 is a diagram showing the insulation base material of the second embodiment in a meandering structure.

DETAILED DESCRIPTION

Figure 1:
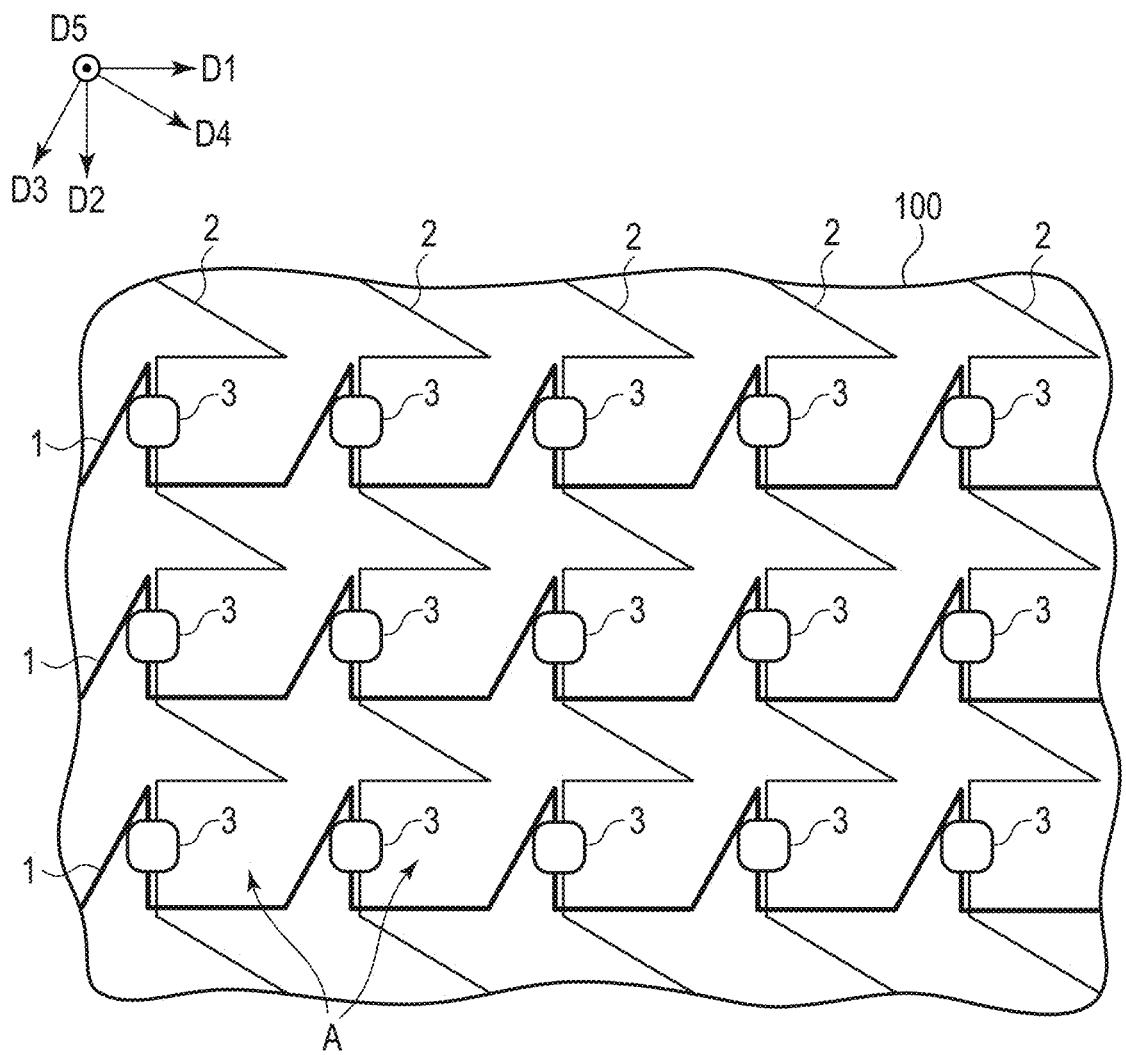
FIG. 1 is a schematic plan view of a flexible substrate according to the first embodiment.

In general, according to one embodiment, a flexible substrate comprises a flexible insulation base material and a plurality of wiring lines provided on one surface side of the insulation base material, the insulation base material comprises a thinned first area and a second area having a thickness larger than that of the first area, the first area comprises a first lower surface, the second area comprises a second lower surface, the first lower surface and the second lower surface are formed on an opposite side of a surface on which the wiring lines are provided, and the first lower surface comprises an inclined portion inclined towards the second lower surface.

According to another embodiment, a flexible substrate comprises a flexible insulation base material and a plurality of wiring lines provided on the insulation base material, the insulation base material comprises, in a cross-sectional shape, an upper surface, a lower surface, a first side surface and a second side surface which connect the upper surface and the lower surface to each other, and one of the first side surface and the second side surface are tapered.

According to still another embodiment, a flexible substrate comprises a flexible insulation base material and a plurality of wiring lines provided on the insulation base material, the insulation base material comprises, in planar view, a first line portion, a second line portion intersecting the first line portion, a third line portion intersecting the first line portion and the second line portion, a first notch portion on an inner side of an intersection portion where the first line portion and the second line portion intersect each other, and a second notch portion on an outer side of the intersection portion, and a third notch portion on an inner side of the intersection portion where the second line portion and the third line portion intersect each other.

Hereinafter, the present embodiments will be described with reference to the drawings. It should be noted that the disclosure is merely an example, and a person having ordinary skill in the art can easily think of appropriate modifications while keeping the gist of the invention, and are naturally included in the scope of the invention. Further, in order to make the description clearer, the drawings may schematically show the width, thickness, shape, etc., of each part as compared with the actual mode, but this is merely an example, and it does not limit the interpretation. Further, in the present specification and the drawings, components having the same or similar functions as those described above with reference to the drawings already described are denoted by the same reference numerals, and redundant detailed description may be appropriately omitted.

First Embodiment

FIG. 1 is a schematic plan view of a flexible substrate 100 according to the first embodiment.

In this embodiment, a first direction D1, a second direction D2, a third direction D3, a fourth direction D4 and a fifth direction D5 are defined as illustrated. The first direction D1, the second direction D2, the third direction D3 and the fourth direction D4 are all parallel to a main surface of the flexible substrate 100 and they intersect with each other. The fifth direction D5 is a direction perpendicular to the first direction D1, the second direction D2, the third direction D3 and the fourth direction D4, and corresponds to a thickness direction of the flexible substrate 100. The first direction D1 and the second direction D2 intersect perpendicularly in the present embodiment, but may intersect at an angle other than vertical. Further, the third direction D3 and the fourth direction D4 intersect perpendicularly in the present embodiment, but may intersect at an angle other than vertical.

The flexible substrate 100 comprises a plurality of scanning lines 1, a plurality of signal lines 2, and a plurality of electrical elements 3. The scanning lines 1 and the signal lines 2 are examples of the wiring lines provided in the flexible substrate 100. The scanning lines 1 and the signal lines 2 each can be formed of, for example, a metal material or a transparent conductive material, and may be of a single- or multilayered structure. The flexible substrate 100 may comprise, in addition to the scanning lines 1 and the signal lines 2, some other types of wiring lines such as power supply lines that supply power to the electrical elements 3.

The scanning lines 1 entirely extend along the first direction D1 and are arranged along the second direction D2. The signal lines 2 entirely extend along the second direction D2 and are arranged along the first direction D1. More specifically, the scanning lines 1 each has a wavy shape in which a straight line portion parallel to the first direction D1, a straight line portion parallel to the third direction D3 and a straight line portion parallel to the second direction D2 are sequentially repeated. Similarly, the signal lines 2 each has a wavy shape in which a straight line portion parallel to the second direction D2, a straight line portion parallel to the fourth direction D4 and a straight line portion parallel to the first direction D1 are sequentially repeated.

Two adjacent scanning lines 1 and two adjacent signal lines 2 form a polygonal area A. In the example shown in FIG. 1, the area A having the same shape is repeated in the first direction D1 and the second direction D2.

The electric elements 3 are electrically connected to the scanning lines 1 and the signal lines 2, respectively. In the example illustrated, the electrical elements 3 are disposed at respective portions where the scanning lines 1 and the signal lines 2 are parallel to the second direction D2. But, the arrangement of the electrical elements 3 where they are disposed is not limited to that of this example.

For example, the electric elements 3 each are a sensor, a semiconductor element, an actuator or the like. Applicable examples of the sensor are an optical sensor that receives visible light or near infrared light, a temperature sensor, a pressure sensor and a touch sensor. Applicable examples of the semiconductor element are a light-emitting element, a light-receiving element, a diode and a transistor. When the electric elements 3 are light-emitting elements, a flexible display having flexibility and elasticity can be realized. Applied examples of the light-emitting element are a light-emitting diode having a size of about 100 μm such as a mini-LED or a micro-LED, and an organic electroluminescence element. When the electric elements 3 are actuators, for example, a piezo-element can be applied. Note that the electrical elements 3 are not limited to those of the one exemplified here, but other elements with various functions can be applied. The electric elements 3 may be capacitors or resistors.

The scanning lines 1 supply scanning signals to the electric elements 3, respectively. For example, when the electric elements 3 involve outputting of signals like a sensor, output signals from the electric elements 3 are supplied to the signal lines 2, respectively. Or, for example, when the electric elements 3 are light-emitting elements or actuators, which operate in response to an input signal, drive signals are supplied to the signal lines 2, respectively. A controller including a scan signal-supply source, a drive signal-supply source, a processor that processes output signals or the like may be provided in the flexible substrate 100 or in a device connected to the flexible substrate 100.

Figure 2:
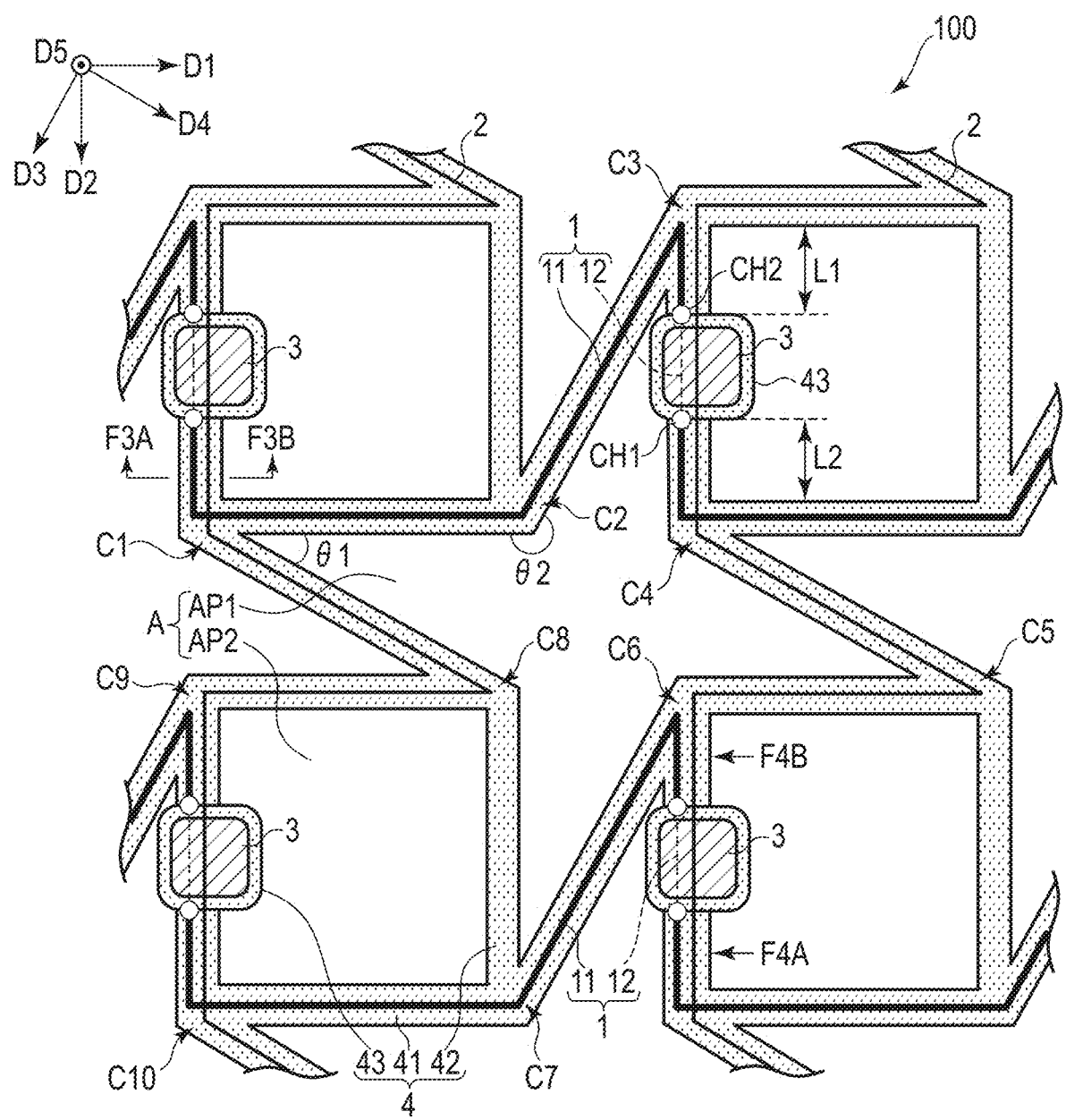
FIG. 2 is a partially enlarged schematic plan view of the flexible substrate.

FIG. 2 is a partially enlarged schematic plan view of the flexible substrate 100.

This drawing shows the state of the vicinity of each electric element 3, where the respective scanning line 1 and the respective signal line 2 extending parallel and close to each other, but in reality, as will be described later with reference to FIG. 3, the scanning line 1 and the signal line 2 are stacked in the thickness direction of the flexible substrate 100.

The flexible substrate 100 includes a flexible insulating base material 4 that supports the scanning lines 1 and the signal lines 2. The insulating base material 4 can be formed of, for example, polyimide, but it is not limited to this example.

The insulating base material 4 includes a plurality of line portions 41, a plurality of line portions 42 (dummy line portions), and a plurality of island-shaped portions 43. Each line portion 41 overlaps at least one of the scanning line 1 and the signal line 2. Each line portion 42 does not overlap the scanning line 1 or the signal line 2. The line portions 41 and the line portions 42 are both linear. Each island-shaped portion 43 overlaps the respective electrical element 3 and is connected to the respective line portion 41.

With the line portions 41 and the line portions 42, polygonal first openings AP1 and polygonal second openings AP2 different from the first openings AP1 are formed. In the example of FIG. 2, the first openings AP1 each are a star-shaped octagon comprising eight corner portions C1 to C8. The second openings AP2 each are a rectangle comprising four corner portions C7 to C10. The corner portions C1 to C10 are portions in which two or more line portions 41, or line portions 41 and 42 are connected to each other at different angles. The shapes of the first openings AP1 and the second openings AP2 are not limited to those of this examples, but various shapes can be adopted.

The line portion 41 between each corner portion C1 and the respective corner portion C2 and the line portion 41 between the respective corner portions C7 and C10 overlap the respective scanning line 1 and are parallel to the first direction D1. The line portion 41 between the respective corner portions C5 and C6 and the line portion 41 between the respective corner portions C8 and C9 overlap the signal line 2 and are parallel to the first direction D1.

The line portion 41 between each corner portion C3 and the respective corner portion C4 and the line portion 41 between the respective corner portions C9 and C10 overlap the respective scanning line 1 and the respective signal line 2 and are parallel to the second direction D2. The line portion 42 between each corner portion C7 and the respective corner portion C8 does not overlap any of the scanning lines 1 and the signal lines 2 and is parallel to the second direction D2.

The line portion 41 between the respective corner portions C2 and C3 and the line portion 41 between the respective corner portions C6 and C7 overlap the respective scanning line 1 and are parallel to the third direction D3. The line portion 41 between the respective corner portions C1 and C8 and the line portion 41 between the respective corner portions C4 and C5 overlap the respective signal line 2 and are parallel to the fourth direction D4.

As described above, the first openings AP1 and the second openings AP2 are each composed of a plurality of respective line portions 41 and 42 extending in four different directions. The first openings AP1 and the second openings AP2 are each included in one area A. Each pair of the first opening AP1 and the second opening AP2 correspond to two areas obtained by dividing the area A by the line portion 42. From another point of view, the line portion 42 is located at the boundary between the first opening AP1 and the second opening AP2. Three or more openings may be formed in the area A by providing two or more line portions 42 in the area A.

An interior angle θ1 of each first opening AP1 at the respective corner portions C1, C3, C5 and C7 is less than an interior angle θ2 of the same first opening AP1 at the respective corner portions C2, C4, C6 and C8 (θ1<θ2). In the example shown in FIG. 2, the interior angle θ1 is an acute angle (θ1<90°) and the interior angle θ2 is an angle exceeding 180° (θ2>180°).

The shape of each first opening AP1 is four-fold symmetry, which takes the same shape when rotated by 90°. The shape is not limited to that of this example, but the first aperture AP1 may have rotational symmetry of four folds or more, such as five-fold symmetry, six-fold symmetry or the like. Further, the first opening AP1 may have a symmetry of three-fold or less.

The island-shaped portions 43 each are disposed near a center of the line portion 41 that overlaps the respective scanning line 1 and the respective signal line 2. The electrical elements 3 are each disposed above the respective island-shaped portion 43. The island-shaped portion 43 is greater in size than the electric element 3, and in FIG. 2, each island-shaped portion 43 protrudes from an edge of the respective electric element 3. For example, let us focus on the line portion 41 between the corner portions C3 and C4. Here, a length L1 from an upper end of the line portion 41 in the drawing to the island-shaped portion 43 and a length L2 from a lower end of the line portion 41 to the island-shaped portion 43 are equal to each other. But, the length L1 and the length L2 may be different from each other.

The scanning lines 1 each include a first portion 11 indicated by a solid line and a second portion 12 indicated by a broken line. The second portion 12 overlaps the respective electrical element 3. The first portion 11 and the second portion 12 are placed in different layers, and are electrically connected to each other via contact holes CH1 and CH2, respectively.

Figure 3:
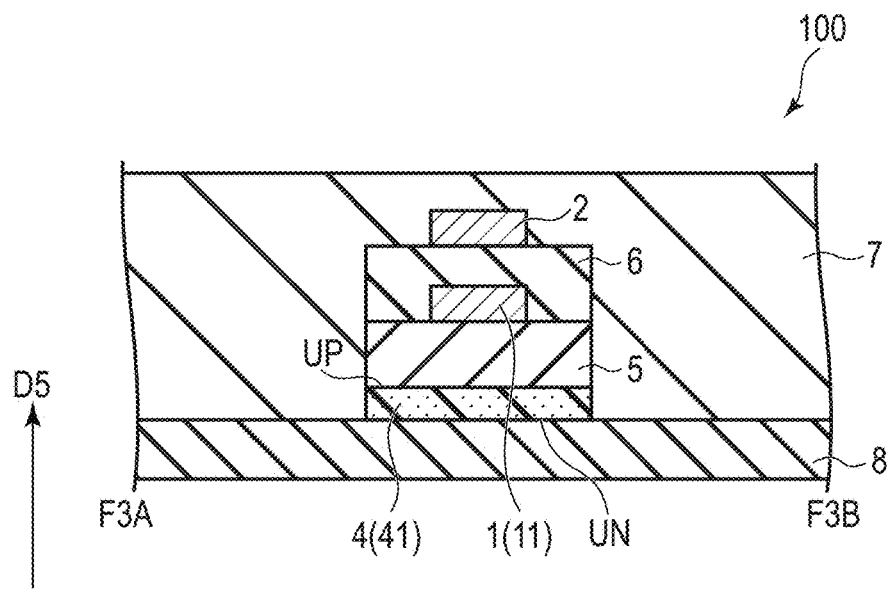
FIG. 3 is a partial schematic cross-sectional view of the flexible substrate, taken along line F3A-F3B in FIG. 2.

FIG. 3 is a partial schematic cross-sectional view of the flexible substrate 100 taken along line F3A-F3B in FIG. 2.

The flexible substrate 100 further includes, in addition to the above-described elements, a first organic insulating layer 5, a second organic insulating layer 6, a coating layer 7, and a support film 8.

The insulating base material 4 comprises an upper surface UP and a lower surface UN on an opposite side to the upper surface UP. The scanning lines 1 and the signal lines 2 are provided on an upper surface UP side of the insulating base material 4. The first organic insulating layer 5 covers the upper surface UP of the insulating base material 4. The scanning lines 1 (the first portions 11) are disposed on the first organic insulating layer 5. The second organic insulating layer 6 covers the scanning lines 1 and the first organic insulating layer 5. The signal lines 2 are disposed on the second organic insulating layer 6. The coating layer 7 covers the signal lines 2, the insulating base material 4, the first organic insulating layer 5 and the second organic insulating layer 6. The support film 8 is in contact with the lower surface UN, and is in contact with the coating layer 7 in a region where there is no insulating base material 4. That is, the support film 8 overlaps a plurality of line portions 41, 42, the first opening AP1 and the second opening AP2 in planar view.

Note that the first organic insulating layer 5 and the second organic insulating layer 6 may as well be provided in regions where there is no insulating base material 4(, that is, the first openings AP1 and the second openings AP2). However, from the viewpoint of flexibility and elasticity of the flexible substrate 100, such an arrangement mode as shown in FIG. 3 is preferable.

The first organic insulating layer 5 and the second organic insulating layer 6 are both made of an organic material. The coating layer 7 is formed of, for example, parylene (polyparaxylylene). The support film 8 may be formed by applying a resin material onto lower surfaces of the insulating base material 4 and the coating layer 7, or may be attached via an adhesive layer.

Figure 4:
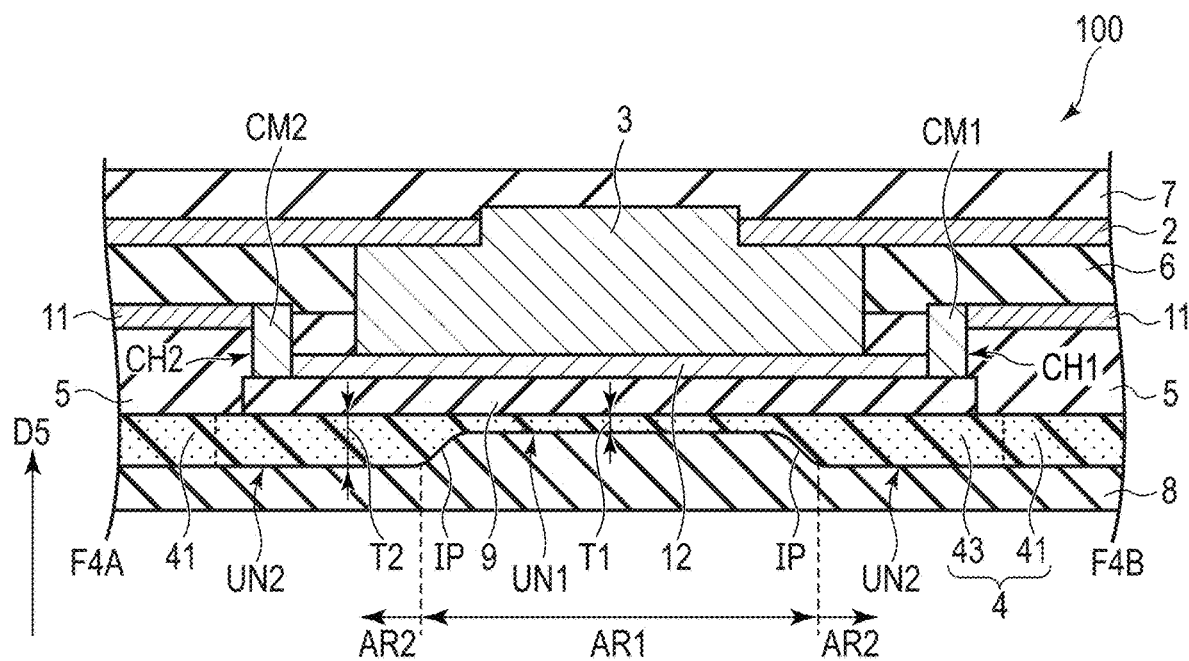
FIG. 4 is a partial schematic cross-sectional view of the flexible substrate, taken along line by F4A-F4B in FIG. 2.

FIG. 4 is a partial schematic cross-sectional view of the flexible substrate 100 taken along line F4A-F4B in FIG. 2.

Below each electrical element 3, the respective island-shaped portion 43 of the insulating base material 4 is disposed. With this structure, the electric element 3 can be reliably supported. The insulating base material 4 includes a partially thinned first area AR1. The location where the first area AR1 is formed is a position where cracks (breaks) may be easily created in the insulating base material 4 as the flexible substrate 100 cannot withstand the expansion when the flexible substrate 100 is deformed by expansion and contraction. Details thereof will be provided later. Further, of the insulating base material 4, a region other than the first area AR1 is referred to as a second area AR2. The first area AR1 has a thickness T1 and the second area AR2 has a thickness T2, which is greater than the thickness T1. That is, the film thickness of the first area AR1 is less than that of the second area AR2. The thickness T1 is, for example, about 5 μm, and the thickness T2 is, for example, about 20 μm. It suffices if the first area AR1 has such a thickness that can maintain the function of supporting the insulating base material 4.

The first area AR1 comprises a first lower surface UN1 and the second area AR2 comprises a second lower surface UN2. The first lower surface UN1 is located closer to a wiring line side such as of the signal lines 1 and the scanning lines 2 than to the second lower surface UN2. Further, the first area AR1 gradually increases its film thickness toward a second area AR2 side. In other words, the first lower surface UN1 includes an inclined portion IP inclined toward the second lower surface UN2. The thus thinned first area AR1 is formed in a region where cracks are likely to occur. The first area AR1 is formed by, for example, laser ashing. Usable examples of the laser are a KrF laser, an excimer laser and the like. Here, for the laser, a wavelength that does not react with the resins other than that of the insulating base material 4 is used.

The support film 8 is in contact with the first lower surface UN1 and the second lower surface UN2. Between the electrical element 3 and the island-shaped portion 43, an inorganic insulating layer 9 (passivation layer) is formed. The inorganic insulating layer 9 has an island-like shape that overlaps the respective electrical element 3 in planar view. The first portion 11 of the scanning line 1 is disposed on the first organic insulating layer 5. The second portion 12 of the scan line 1 is disposed on the inorganic insulating layer 9 (that is, below the first organic insulating layer 5). The second portion 12 is electrically connected to the electric element 3. In the example shown in FIG. 4, end portions of the second portion 12 are covered by the first organic insulating layer 5.

The above-described contact holes CH1 and CH2 are provided in the first organic insulating layer 5 in a region which overlaps the island-shaped portion 43 and the inorganic insulating layer 9 in planar view. The first portion 11 of the scanning line 1 is electrically connected to the second portion 12 via connecting members CM1 and CM2 disposed in the contact holes CH1 and CH2, respectively. The connecting members CM1 and CM2 may be a part of the first portion 11 or may be provided separate from the first portion 11.

According to this embodiment, the insulating base material 4 comprises the thinned first area AR1 in a location where cracks are likely to occur. When the flexible substrate 100 is stretched and it reaches a predetermined elongation, cracks may occur in the insulating base material 4 and the wiring. However, the elongation up to the cracking can be improved by thinning of the insulating base material 4. Therefore, the expansion rate of the flexible substrate 100 can be improved. Further, the occurrence of cracks can be suppressed.

Further, according to this embodiment, the insulating base material 4 comprises the first opening AP1 and the second opening AP2. With the first opening AP1 and the second opening AP2 with different shapes thus provided, elasticity and flexibility in various directions can be imparted to the flexible substrate 100. Further, the line portions 41 and the line portions 42, which form the first opening AP1 and the second opening AP2, respectively, are of a linear shape, which is the basics of general array design. With this structure, the narrowing of the pitch of the scanning lines 1 and the signal lines 2 and the high densification of the electrical elements 3 can be achieved much easier as compared to the case where a curved pattern such as a meander shape is employed.

Each line portion 42 does not overlap the respective scanning line 1 or signal line 2. Thus, with the line portion 42 that does not support the wiring, appropriate shapes can be realized for the first opening AP1 and the second opening AP2 regardless of the shapes of the scanning lines 1 and the signal lines 2.

Each first opening AP1 and the respective second opening AP2 are included in an area A defined by two adjacent scanning lines 1 and respective two adjacent signal lines 2. Since areas A are arranged in a matrix over the entire flexible substrate 100, the first openings AP1 and the second openings AP2 are also dispersedly arranged on the entire flexible substrate 100. With this structure, excellent elasticity and flexibility can be impart to a wide region of the flexible substrate 100.

Further, in the example shown in FIG. 2, the first opening AP1 has a four-fold symmetrical shape. Therefore, the direction dependency of the elasticity and flexibility of the flexible substrate 100 can be reduced as compared with the case where, for example, the first opening AP1 has a two-fold symmetrical shape. Further, in the example shown in FIG. 2, the first opening AP1 includes an interior angle θ2 of 180° or more. With a shape including such a large internal angle, the area of the first opening AP1 can be reduced as compared to the case where the first opening AP1 is formed only by internal angles less than 180°. Thus, the scanning lines 1, the signal lines 2 and the electrical elements 3 can be formed at high density.

As shown in FIG. 4, an island-shaped inorganic insulating layer 9 is arranged between the electric element 3 and the insulating base material 4. Since the electrical element 3 and the second portion 12 of the scanning line 1 are protected by the inorganic insulating layer 9, the reliability of the flexible substrate 100 can be improved. On the other hand, inorganic films are more likely to be cracked than organic films, and therefore, when wiring is provided on the inorganic film, disconnection may occur when cracks occur. Here, in FIG. 4, the inorganic insulating layer 9 is not provided below the first portion 11 of the scanning line 1 or the signal line 2. Therefore, disconnection of the scanning lines 1 and the signal lines 2 is unlikely to occur. Further, if the inorganic insulating layer 9 is provided over the entire flexible substrate 100, the elasticity and flexibility of the flexible substrate 100 may be impaired. However, if the inorganic insulating layer 9 is formed into an island shape, such a problem does not occur.

Moreover, the first portion 11 and the second portion 12 of the scanning line 1 disposed in different layers are connected by the contact holes CH1 and CH2. With this structure, the degree of freedom in designing in the vicinity of the electric element 3 is improved. Here, the contact holes CH1 and CH2 are provided above the inorganic insulating layer 9, and therefore the reliability at the connection position between the first portion 11 and the second portion 12 is also improved.

As shown in FIG. 2, each electric element 3 is disposed in the line portion 41, and is located at a position apart from the connection point between the line portions 41. With this structure, even when the flexible substrate 100 is expanded, contracted or bent, the stress is unlikely to be transmitted to the vicinity of each electrical element 3. Therefore, the reliability of the electric elements 3 is improved. As described above, if the lengths L1 and L2 from respective ends of the line portions 41 to the respective island-shaped portion 43 are equal to each other, the stress to be applied to the respective electrical element 3 can be reduced extremely well.

In addition to the above, various advantageous effects can be obtained from this embodiment.

Figure 5:
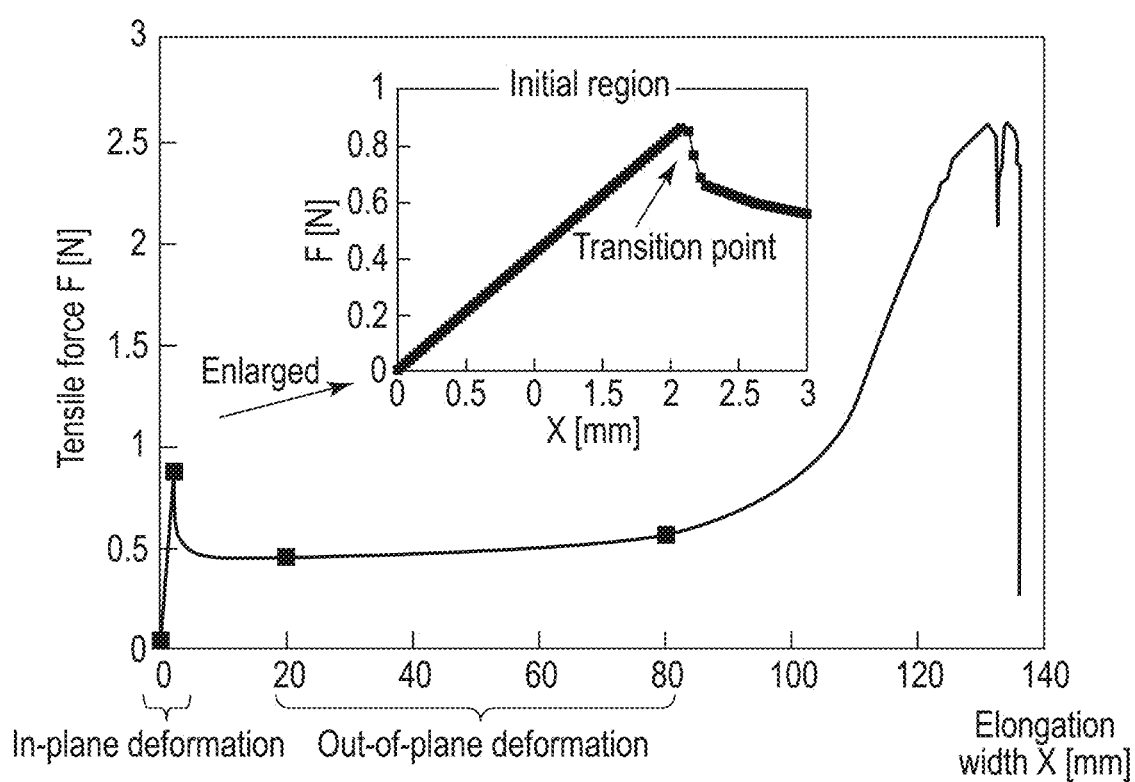
FIG. 5 is a graph showing the characteristics of deformation when the flexible substrate is expanded.

FIG. 5 is a graph showing the characteristic of deformation when the flexible substrate 100 is expanded.

The vertical axis of the graph indicates the tensile force F [N]. The horizontal axis of the graph indicates the extension width X [mm]. When the flexible substrate 100 is expanded, in-plane deformation occurs in the initial stage. Here, the in-plane deformation means deformation in a direction parallel to a D1-D2 plane defined by the first direction D1 and the second direction D2. In the flexible substrate 100, the deformation switches from a certain extension or more to an out-of-plane deformation. Here, the out-of-plane deformation is equivalent to the case of being deformed in a direction twisted with respect to the D1-D2 plane, that is, in the fifth direction D5. In the above-described embodiment, the extension width that can be deformed out of the plane with respect to the tensile force can be increased by thinning the insulating base material 4. Therefore, the expansion rate of the flexible substrate 100 can be increased.

The shapes of the openings of the insulating base material 4 and the shapes of the region formed by the scanning lines 1 and the signal lines 2 are not limited to those disclosed in the above-provided embodiment. For example, the insulating base material 4 may not include a line portion 42 that does not overlap any of the scanning lines 1 or the signal lines 2. Further, the insulating base material 4 may at least partially include a curved line portion in addition to the linear line portions. For example, the insulating base material 4 may have a corrugated shape as shown in FIG. 7 or may have various shapes including a spiral.

Figure 6:
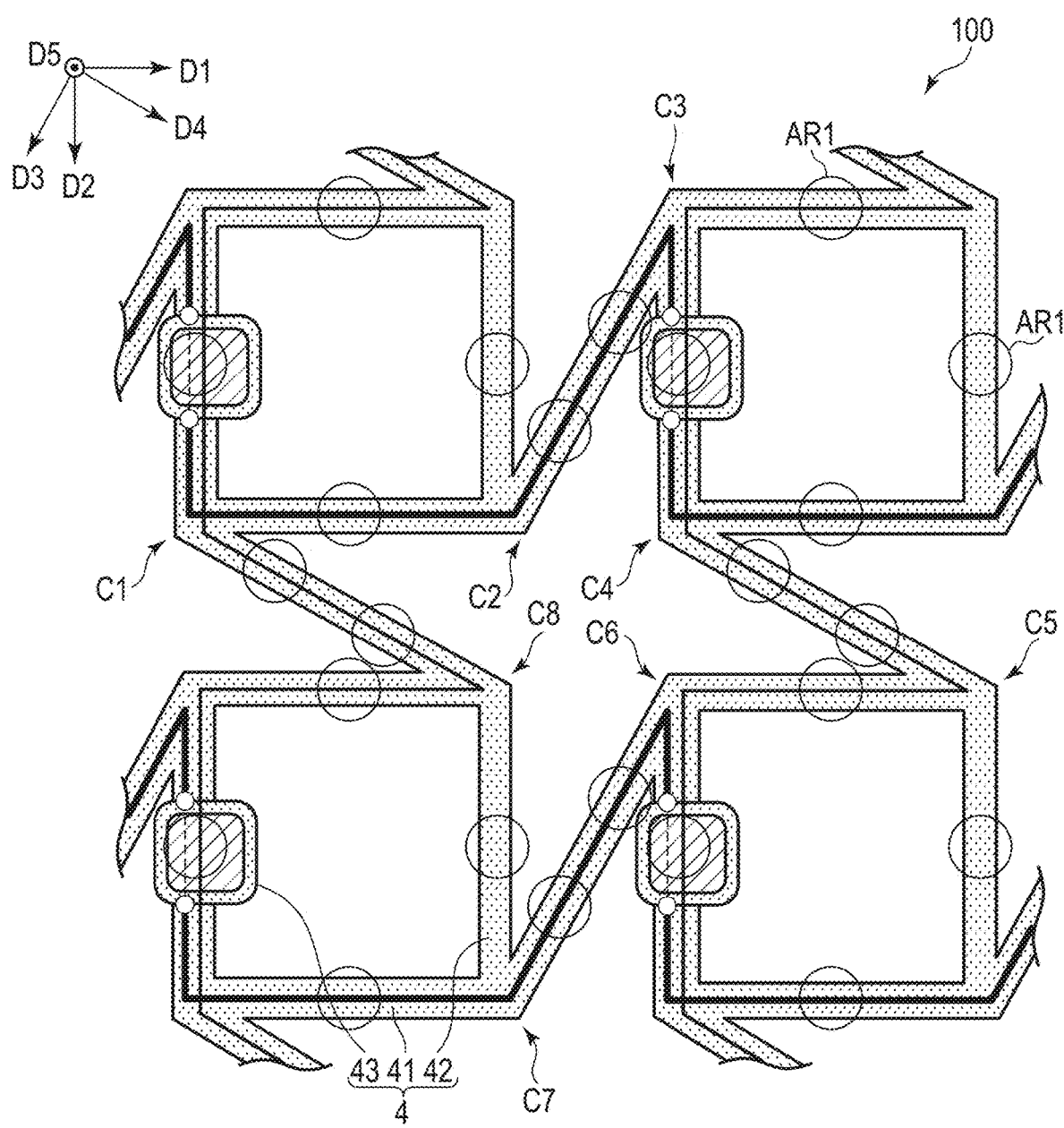
FIG. 6 is a plan view showing a portion of the flexible substrate, where cracks are likely to occur.

FIG. 6 is a plan view showing portions of the flexible substrate 100, where cracks are likely to occur.

In each portion surrounded by a circle in the drawing, cracks are likely to occur, and thus the portion corresponds to the first area AR1, which is the thinned portion of the insulating base material 4. The first areas AR1 are located, for example, in a center of the line portion 41 extending in the first direction D1, in a center of the line portion 41 extending in the second direction D2, and in a center of the line portion 42 extending in the second direction D2. Further, the first areas AR1 are located in the vicinities of the corner portions C2, C3, C6 and C7 of the line portion 42 extending in the third direction D3, and the vicinities of the corner portions C1, C8, C4 and C5 of the line portion 42 extending in the fourth direction D4. In the first areas AR1, the flexible substrate 100 has a layer structure equivalent to that of the first areas AR1 of the insulating base material 4 shown in FIG. 4. With this structure, the out-of-plane deformation can be promoted only in the locations where cracks are likely to occur, and a margin for fracture elongation can be secured.

Figure 7:
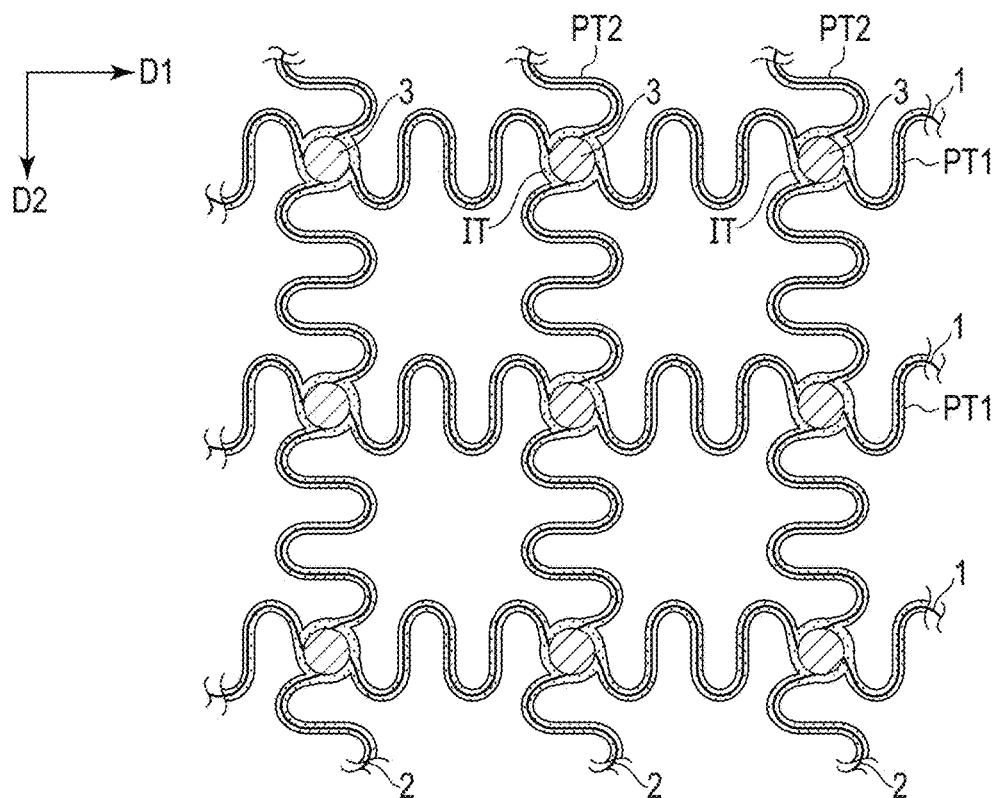
FIG. 7 is a plan view showing another shape of the insulating base material.

FIG. 7 is a plan view showing another shape of the insulating base material 4.

The insulating base material 4 includes a plurality of first portions PT1 extending in the first direction D1 and arranged side by side along the second direction D2 and a plurality of second portions PT2 extending in the second direction D2 and arranged side by side along the first direction D1. The first portion PT1 and the second portion PT2 are each wave-shaped. Further, the insulating base material 4 comprises intersection portions IT formed between the respective first portions PT1 and the respective second portions PT2. The scanning lines 1 are each located on the respective first portion PT1, extend in the first direction D1 and are arranged along the second direction D2. The signal lines 2 are each located on the respective second portion PT2, extend in the second direction D2 and are arranged along the first direction D1. The electrical elements 3 are each located on the respective intersection portion IT.

Figure 8:
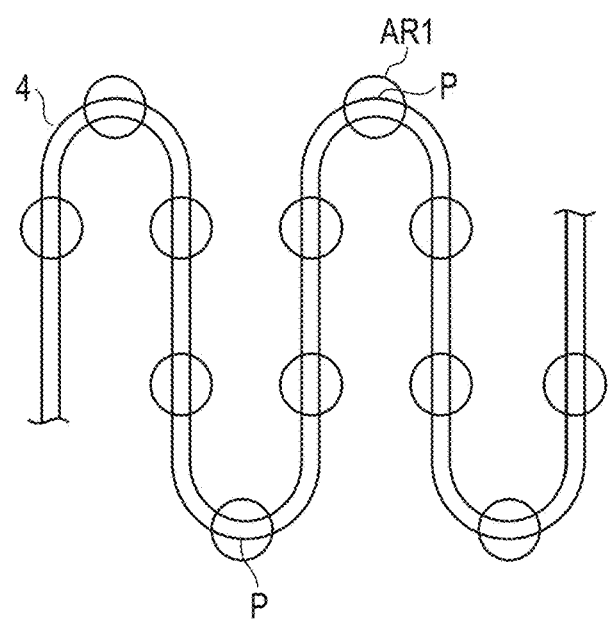
FIG. 8 is a plan view showing a part of the insulating base material shown in FIG. 7.

FIG. 8 is a partial plan view of the insulating base material 4 shown in FIG. 7.

Portions surrounded by circles in the drawing correspond to the first areas AR1, where cracks are likely to occur. The first regions R1 are located near tops P of the waveforms. Further, the first areas AR1 are each located at a respective position where the bending is maximized when the flexible substrate 100 extends between respective tops P. In the first areas AR1 of the flexible substrate 100, the insulating base material 4 is thinned as in the case of the first areas AR1 shown in FIG. 4. Even with such a pattern of the insulating base material 4, advantageous effects similar to those of the pattern shown in FIG. 6 can be obtained.

Second Embodiment

Figure 9:
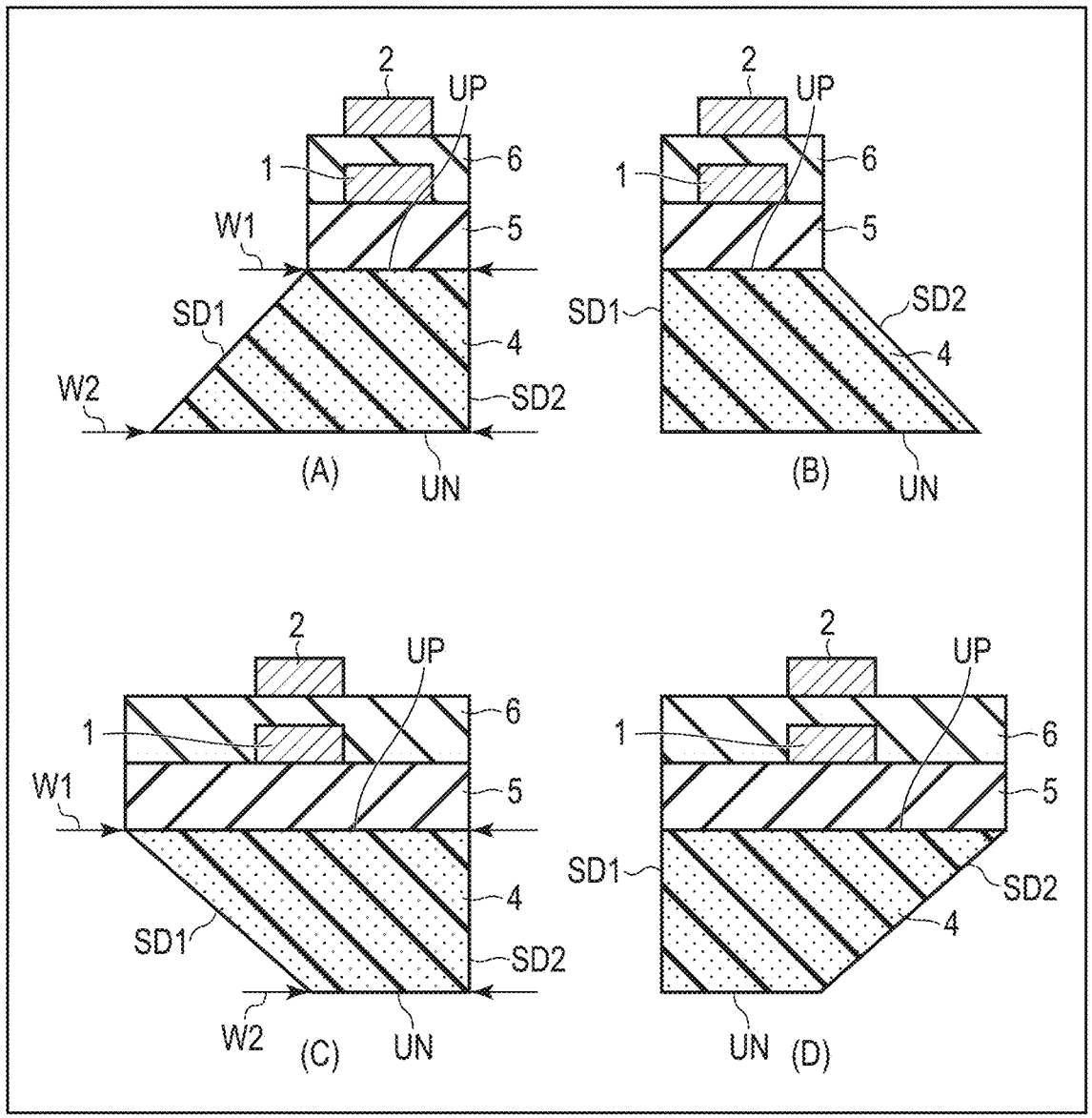
FIG. 9 is a cross-sectional view showing the shape of an insulating base material in the second embodiment.

FIG. 9 is a cross-sectional view showing the shape of an insulating base material 4 in the second embodiment.

FIG. 9 shows a cross section as shown in FIG. 3 when the support film 8 and the coating layer 7 are omitted therefrom. The insulating base material 4 comprises, in a cross-sectional shape thereof, an upper surface UP, a lower surface UN, a first side surface SD1 and a second side surface SD2, which connect the upper surface UP and the lower surface UN to each other. The upper surface UP is in contact with the first organic insulating layer 5.

In the example shown in FIG. 9, parts (A) and (B), a width W1 of the upper surface UP is less than a width W2 of the lower surface UN. In FIG. 9, part (A), the first side surface SD1 is tapered and the second side surface SD2 is not tapered. In FIG. 9, part (B), the second side surface SD2 is tapered and the first side surface SD1 is not tapered. In the example shown in FIG. 9, parts (A) and (B), the width W1 of the upper surface UP is 10 µm or more, and the width W2 of the lower surface UN is 50 µm or less.

In the example shown in FIG. 9, parts (C) and (D), the width W2 of the lower surface UN is less than the width W1 of the upper surface UP. In FIG. 9, part (C), the first side surface SD1 is tapered and the second side surface SD2 is not tapered. In FIG. 9, part (D), the second side surface SD2 is tapered and the first side surface SD1 is not tapered. In the example shown in FIG. 9, parts (C) and (D), the width W2 of the lower surface UN is 10 µm or more, and the width W1 of the upper surface UP is 50 µm or less. In FIG. 9, parts (C) and (D), since the upper surface UP on the wiring side is wide, displacement of the wiring can be dealt with.

The tapered shape as shown in FIG. 9, parts (A) to (D), is formed by, for example, laser asking. Alternatively, the insulating base material 4 may be formed by applying laser onto the insulating base material 4 from a direction oblique to the normal line of the main surface of the substrate. Usable examples of the laser are a KrF laser, an excimer laser and the like. For the laser, a wavelength that does not react with the resins other than that of the insulating base material 4 is used.

According to the second embodiment, one of the first side surface SD1 and the second side surface SD2 is formed into a tapered shape, and therefore the insulating base material 4 is easily twisted. That is, the insulating base material 4 is configured to promote the out-of-plane deformation, and thus the elongation of the flexible substrate 100, when it expands before it breaks, can be improved. Thus, the expansion rate of the flexible substrate 100 can be improved. Further, the occurrence of cracks can be suppressed.

FIG. 10 is a diagram showing the insulating base material 4 of the second embodiment in a meander structure.

FIG. 10, part (1) is a partial plan view of the meander structure. FIG. 10, parts (2) and (3), shows cross sections of the insulating base material 4 in regions a to f shown in FIG. 10, part (1).

When the flexible substrate is expanded, the regions a, c, and e are easily twisted counterclockwise, and the regions b, d, and f are easily twisted clockwise. Further, the direction of twist is determined by the tapered shape of the insulating base material 4. For example, in the example shown in FIG. 10, part (2), the configurations (a) to (f) are of the cases where the width of the upper surface UP is less than the width of the lower surface UN. Further, the configurations (a), (c) and (e) are of the cases where the second side surface SD2 is tapered and is easily twistable counterclockwise. The configurations (b), (d) and (f) are of the cases where the first side surface SD1 has a tapered shape, and is easily twistable clockwise. That is, in the regions a, c and e, originally, a counterclockwise force is applied, whereas in the regions b, d and f, originally, a clockwise force is applied. Therefore, by forming a taper shape, a force can be easily applied further to the direction in which the original force is applied. Thus, the force in the direction of repulsing the twist can be suppressed and the twisting of the insulating base material 4 can be promoted.

For example, in the example shown in FIG. 10, part (3), the width of the upper surface UP is greater than the width of the lower surface UN in the configurations (a) to (f). Further, in the configurations (a), (c) and (e), the first side surface SD1 is tapered, and is easily twistable counterclockwise. In the configurations (b), (d) and (f), the second side surface SD2 is tapered, and is easily twistable clockwise. Thus, as in the case shown in FIG. 10, part (2), the force in the direction of repulsing the twisting can be suppressed, and the twisting of the insulating base material 4 can be promoted. Here, note that it is desirable that the combination of the tapers be prepared in such a manner that the clockwise and counterclockwise forces are equal to each other. Further, the insulating base material 4 may be formed in a tapered shape only in a portion where cracks are likely to occur, or may be tapered in its entirety.

Third Embodiment

Figure 11:
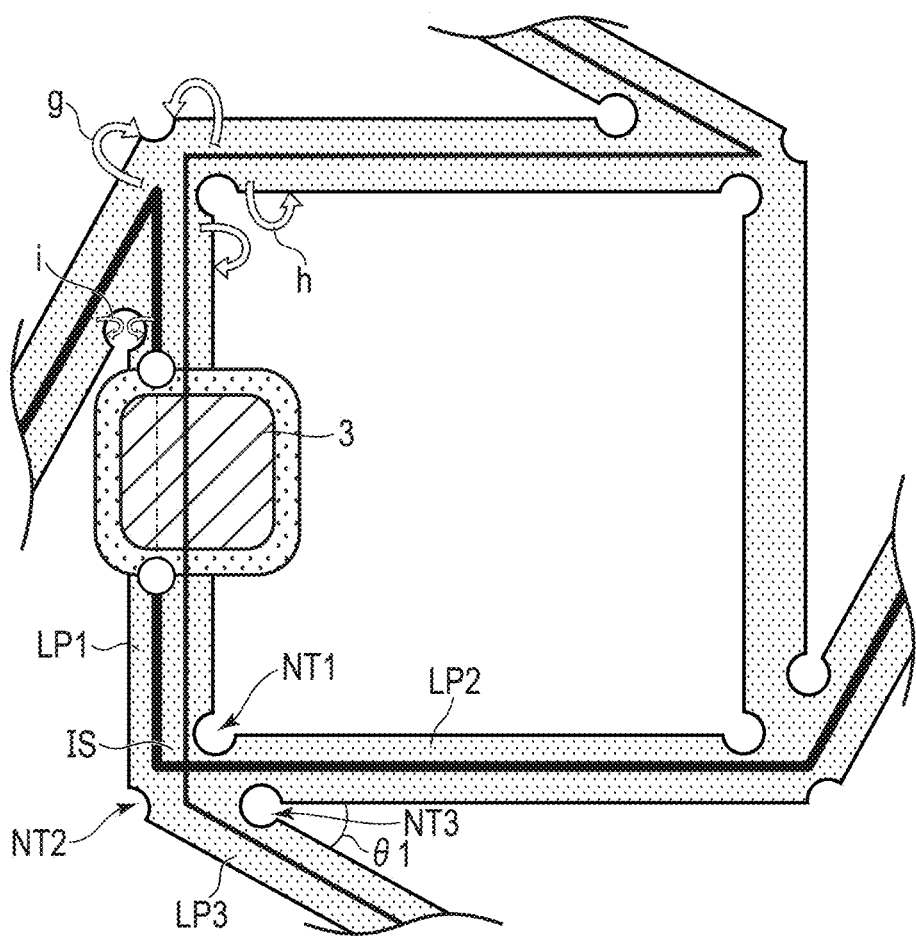
FIG. 11 is a plan view showing the shape of an insulating base material in the third embodiment.

FIG. 11 is a plan view showing the shape of an insulating base material 4 in the third embodiment.

The insulating base material 4 includes a first line portion LP1, a second line portion LP2, and a third line portion LP3 in planar view. The first line portion LP1, the second line portion LP2 and the third line portion LP3 intersect each other at an intersection portion IS. The first line portion LP1 and the second line portion LP2 intersect at substantially right angles. The second portion LP2 and the third portion LP3 intersect at an acute internal angle θ1. The insulating base material 4 includes, in each intersecting portion IS, a first notch portion NT1 on an inner side where the first line portion LP1 and the second line portion LP2 intersect each other, and a second notch portion NT2 on an outer side. Similarly, in the intersecting portion IS, a third notch portion is provided on an inner side where the second portion LP2 and the third portion LP3 intersect each other. The notch portions are formed, for example, by adjusting the conditions for the resist mask and laser asking. Usable examples of the laser are a KrF laser, an excimer laser and the like.

In each intersection portion IS, on the outer side where the first line LP1 and the second line LP2 intersect each other, stress is applied to the inner side as indicated by an arrow g. On the inner side where the first line portion LP1 and the second line portion LP2 intersect each other, stress is applied on the outer side as indicated by an arrow h. In the inner side where the second line portion LP2 and the third line portion LP3 intersect each other, stress is applied on the outer side as indicated by an arrow i. As discussed in the third embodiment, these types of stress can be released by forming the first notch portion NT1, the second notch portion NT2 and the third notch portion NT3. Thus, it is possible to improve the elongation of the flexible substrate 100, which can expand to a point before it breaks. Therefore, the expansion rate of the flexible substrate 100 can be improved. Moreover, the occurrence of cracks can be suppressed.

As described above, according to the present embodiment, it is possible to obtain a flexible substrate with an improved elongation rate and suppressed occurrence of cracks.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A flexible substrate comprising:
a support film;
a flexible insulation base material provided on the support film; and
a plurality of wiring lines provided on one surface side of the insulation base material, wherein
the insulation base material comprises a thinned first area and a second area having a thickness larger than that of the first area,
the first area comprises a first lower surface,
the second area comprises a second lower surface,
the support film is in contact with the first lower surface and the second lower surface,
the first lower surface and the second lower surface are formed on an opposite side of a surface on which the wiring lines are provided, and
the first lower surface comprises an inclined portion inclined towards the second lower surface.

2. The flexible substrate of claim 1, wherein
a thickness of the first area is approximately 5 μm.

3. The flexible substrate of claim 1, wherein
the insulation base material comprises a first opening, a second opening having a shape different from that of the first opening, and a line portion between the first opening and the second opening, and
in planar view, the line portion is located without superposing the plurality of wiring lines.

4. The flexible substrate of claim 1, wherein
the insulation base material comprises a plurality of wave-shaped first portions extending in a first direction and arranged along a second direction intersecting the first direction, and a plurality of wave-shaped second portions extending in the second direction and arranged along the first direction.

5. A flexible substrate comprising:
a flexible insulation base material; and
a plurality of wiring lines provided on the insulation base material, wherein
the insulation base material comprises, in a cross-sectional shape, an upper surface, a lower surface, a first side surface and a second side surface which connect the upper surface and the lower surface to each other,
one of the first side surface and the second side surface is tapered, and
the insulation base material comprises a plurality of wave-shaped first portions extending in a first direction and arranged along a second direction intersecting the first direction, and a plurality of wave-shaped second portions extending in the second direction and arranged along the first direction.

6. The flexible substrate of claim 5, wherein
a width of the upper surface is less than a width of the lower surface.

7. The flexible substrate of claim 5, wherein
a width of the lower surface is less than a width of the upper surface.

8. A flexible substrate comprising:
a flexible insulation base material; and
a plurality of wiring lines provided on the insulation base material, wherein
the insulation base material comprises, in planar view, a first line portion, a second line portion intersecting the first line portion, a third line portion intersecting the first line portion and the second line portion, a first notch portion on an inner side of an intersection portion where the first line portion and the second line portion intersect each other, and a second notch portion on an outer side of the intersection portion, and a third notch portion on an inner side of the intersection portion where the second line portion and the third line portion intersect each other.

9. The flexible substrate of claim 8, wherein
the first line portion and the second line portion intersect each other at substantially right angles, and
the second line portion and the third line portion intersect each other at an acute angle.

10. The flexible substrate of claim 8, wherein
the insulation base material comprises a first opening, a second opening having a shape different from that of the first opening and a fourth line portion between the first opening and the second opening, and
the fourth line portion is located, in planar view, without superimposing the plurality of wiring lines.

* * * * *